US012512300B2

(12) United States Patent
Thimot

(10) Patent No.: US 12,512,300 B2
(45) Date of Patent: Dec. 30, 2025

(54) ELECTRIC FIELD UNIFORMITY ON DISTRIBUTED ELECTRODE

(71) Applicant: ASM IP HOLDING B.V., Almere (NL)

(72) Inventor: Jordan Alexander Thimot, Philadelphia, PA (US)

(73) Assignee: ASM IP HOLDING B.V. (NL)

( * ) Notice: Subject to any disclaimer, the term of this patent is extended or adjusted under 35 U.S.C. 154(b) by 50 days.

(21) Appl. No.: 18/673,736

(22) Filed: May 24, 2024

(65) Prior Publication Data

US 2024/0404792 A1 Dec. 5, 2024

Related U.S. Application Data

(60) Provisional application No. 63/504,927, filed on May 30, 2023.

(51) Int. Cl.
*H01J 37/32* (2006.01)

(52) U.S. Cl.
CPC .... *H01J 37/32266* (2013.01); *H01J 37/3222* (2013.01); *H01J 37/32229* (2013.01)

(58) Field of Classification Search
CPC ............. H01J 37/32266; H01J 37/3222; H01J 37/32229
See application file for complete search history.

(56) References Cited

U.S. PATENT DOCUMENTS

| | | | | |
|---|---|---|---|---|
| 5,003,152 | A | | 3/1991 | Matsuo |
| 5,172,083 | A | | 12/1992 | Hidaka |
| 5,302,803 | A | | 4/1994 | Stevens |
| 5,387,288 | A | * | 2/1995 | Shatas ................. H01J 37/3222 118/712 |
| 5,517,085 | A | | 5/1996 | Engemann |
| 5,646,489 | A | | 7/1997 | Kakehi |
| 5,874,706 | A | | 2/1999 | Ishii |
| 6,343,565 | B1 | | 2/2002 | Hongoh |
| 6,657,151 | B2 | | 12/2003 | Ishii |
| 6,884,318 | B2 | | 4/2005 | Suzuki |

(Continued)

FOREIGN PATENT DOCUMENTS

| | | | | | |
|---|---|---|---|---|---|
| BR | 102019022232 | A2 | * | 11/2020 | ......... C23C 14/0605 |
| CN | 111916329 | A | * | 11/2020 | ............... H05H 1/02 |

(Continued)

*Primary Examiner* — Adam D Houston

(74) *Attorney, Agent, or Firm* — The Belles Group, P.C. (ASM)

(57) ABSTRACT

In one embodiment, the present disclosure is directed to a system for providing improved electric field uniformity to a plasma chamber receiving multiple signal inputs. The system includes one or more dielectrics distributing received energy to one or more antennas. The one or more dielectrics have N receiving areas. N circular waveguides are positioned over the N receiving areas. Each of waveguides has a mode converter converting a received first transverse mode signal to a second transverse mode signal to be output by the circular waveguide to the corresponding receiving area. At least one phase adjuster circuit adjusts the phase of at least one of the first transverse mode signals such that adjacent circular waveguides have their received first transverse mode signals differ in phase by approximately 360/N.

20 Claims, 10 Drawing Sheets

(56) References Cited

U.S. PATENT DOCUMENTS 6,908,530 B2 6/2005 Huang
6,910,440 B2 6/2005 Ishii
7,071,442 B2 7/2006 Ishii
7,128,805 B2 10/2006 Huang
7,305,934 B2 12/2007 Ishii
7,430,985 B2 10/2008 Kasai
7,582,569 B2 9/2009 Ohmi
7,895,971 B2 3/2011 Tian
8,075,733 B2 * 12/2011 Watanabe ......... H01J 37/32293 118/723 MR
8,216,420 B2 7/2012 Kazumi
8,900,402 B2 * 12/2014 Holland ............ H01J 37/32633 438/711
9,105,450 B2 8/2015 Hirayama
9,241,397 B2 1/2016 Kaneko
9,583,314 B2 2/2017 Tamura
9,941,126 B2 4/2018 Funk
10,340,124 B2 7/2019 Kobayashi
10,424,462 B2 9/2019 Funk
10,748,745 B2 8/2020 Kraus
10,950,414 B2 * 3/2021 Nam ................. H01J 37/32422
11,348,783 B2 5/2022 Kobayashi
11,798,788 B2 * 10/2023 Nam ................. H01J 37/32596
11,887,812 B2 * 1/2024 Nguyen ............ H01J 37/32128
11,942,309 B2 * 3/2024 Singh ................ H01J 37/32706
11,948,776 B2 4/2024 Hsu
2001/0011525 A1 8/2001 Ishii
2003/0178143 A1 9/2003 Perrin
2004/0026039 A1 2/2004 Goto
2004/0051463 A1 3/2004 Sakamoto
2005/0011455 A1 1/2005 Yamamoto
2005/0205016 A1 9/2005 Sugai
2007/0045242 A1 3/2007 Goto
2007/0119376 A1 5/2007 Ishii
2008/0190560 A1 8/2008 Tian
2010/0096362 A1 4/2010 Hirayama
2010/0307684 A1 12/2010 Ota
2011/0114600 A1 5/2011 Hirayama
2012/0180953 A1 7/2012 Ozaki
2012/0186747 A1 7/2012 Obama
2014/0251541 A1 9/2014 Iwao
2017/0263417 A1 9/2017 Ikeda
2018/0342374 A1 * 11/2018 Liang .................. H01J 37/3244
2019/0122860 A1 * 4/2019 Lee ..................... H01L 21/6831
2019/0122867 A1 * 4/2019 Nam ....................... H01J 1/025
2019/0157042 A1 * 5/2019 Van Zyl ............ H01J 37/32146
2019/0189399 A1 6/2019 Kobayashi
2019/0362944 A1 11/2019 Kobayashi
2020/0211825 A1 7/2020 Chang
2022/0020569 A1 1/2022 Hirayama
2022/0359162 A1 11/2022 Tamura
2023/0352274 A1 11/2023 Hitoshi
2024/0404792 A1 * 12/2024 Thimot ............. H01J 37/32229
2025/0046629 A1 * 2/2025 Yeom ................ H01J 37/32422

FOREIGN PATENT DOCUMENTS

JP H06287761 A 10/1994
JP 2012049353 A 3/2012
WO WO-2008123605 A1 * 10/2008 ........ H01J 37/32449
WO WO-2024091420 A1 * 5/2024 ....... C23C 16/45572

* cited by examiner

ELECTRIC FIELD UNIFORMITY ON DISTRIBUTED ELECTRODE

CROSS REFERENCE TO RELATED APPLICATIONS

The present application claims the benefit of U.S. Provisional Patent Application No. 63/504,927 filed on May 30, 2023, which is incorporated herein by reference in its entirety.

BACKGROUND

In a semiconductor fabrication system, one approach for reducing film deposition or etch times is to use a higher density plasma (HDP). One method for creating HDP is to increase the frequency of the RF source. As the frequency of the RF source is increased, however, its wavelength decreases and can become comparable to the dimensions in the plasma chamber. A microwave HDP source, such as one operating at 2.45 GHz, can have wavelengths of approximately 120 mm in vacuum and less (20-70 mm) in plasma. Over this wavelength, the electric field can be very non-uniform. With a 300 mm wafer, the variation of the electric field over the antenna, and consequently in the plasma, can also be very non-uniform. There is a need to make this electric field more uniform and thus provide better uniformity of deposited film or etch over the surface of the wafer.

BRIEF SUMMARY

The present disclosure may be directed, in one aspect, to a system for providing energy to a plasma chamber having multiple power signal inputs, the system comprising one or more dielectrics configured to distribute received energy to one or more antennas of a plasma chamber, the one or more dielectrics comprising N receiving areas positioned at a substantially equal distance from each other and at a substantially equal distance from a center point, wherein N is a natural number greater than one; N circular waveguides positioned over the N receiving areas of the one or more dielectrics such that each receiving area of the N receiving areas has a corresponding circular waveguide of the N circular waveguides, wherein each of the N circular waveguides comprises an input end, an output end, and a mode converter positioned between the input end and the output end and configured to convert a received first transverse mode signal to a second transverse mode signal to be output by the circular waveguide to the corresponding receiving area of the one or more dielectrics; and at least one phase adjuster circuit configured to adjust the phase of at least one of the first transverse mode signals received by the N circular waveguides such that, of the N circular waveguides, those adjacent have their received first transverse mode signals differ in phase by approximately 360/N.

In another aspect, a semiconductor processing system includes a power source transmitting, via N outputs, N first transverse mode signals, wherein N is a natural number greater than 1; at least one phase adjuster circuit; and a plasma chamber comprising N circular waveguides configured to receive the N first transverse mode signals, wherein each of the N circular waveguides comprises an input end; an output end; and a mode converter positioned between the input end and the output end and configured to convert the received first transverse mode signal to a second transverse mode signal to be output by the circular waveguide; and one or more dielectrics configured to receive the second transverse mode signals from the N circular waveguides and to distribute energy from the second transverse mode signals to one or more antennas of the plasma chamber, the one or more dielectrics comprising N receiving areas positioned at a substantially equal distance from each other and at a substantially equal distance from a center point; wherein the N circular waveguides are positioned adjacent to the N receiving areas of the one or more dielectrics such that each receiving area of the N receiving areas has a corresponding circular waveguide of the N circular waveguides; and wherein the at least one phase adjuster circuit is configured to adjust the phase of at least one of the first transverse mode signals received by the N circular waveguides such that the received first transverse mode signals differ in phase by approximately 360/N for adjacent ones of the N circular waveguides.

In another aspect, a system for providing energy to a plasma chamber having multiple power signal inputs is disclosed, the system comprising N dielectrics evenly positioned at a substantially equal distance from a center point, wherein N is a natural number greater than one; N antennas, wherein each dielectric of the N dielectrics is positioned over a corresponding antenna of the N antennas, and each dielectric of the N dielectrics is configured to provide received energy to its corresponding antenna of the N antennas; N circular waveguides, wherein each of the N circular waveguides is positioned over a corresponding one of the N dielectrics, wherein each of the N circular waveguides comprises an input end; an output end; and a mode converter positioned between the input end and the output end and configured to convert a received first transverse mode signal to a second transverse mode signal to be output by the circular waveguide to the corresponding dielectric of the one or more dielectrics; and at least one phase adjuster circuit configured to adjust the phase of at least one of the transverse mode signals received by the N circular waveguides such that the received transverse mode signals differ in phase by approximately 360/N for adjacent ones of the N circular waveguides.

While the disclosed inventions are applicable to semiconductor fabrication systems, the invention is not so limited.

BRIEF DESCRIPTION OF THE DRAWINGS

The present disclosure will become more fully understood from the detailed description and the accompanying drawings, wherein.

Figure 1:
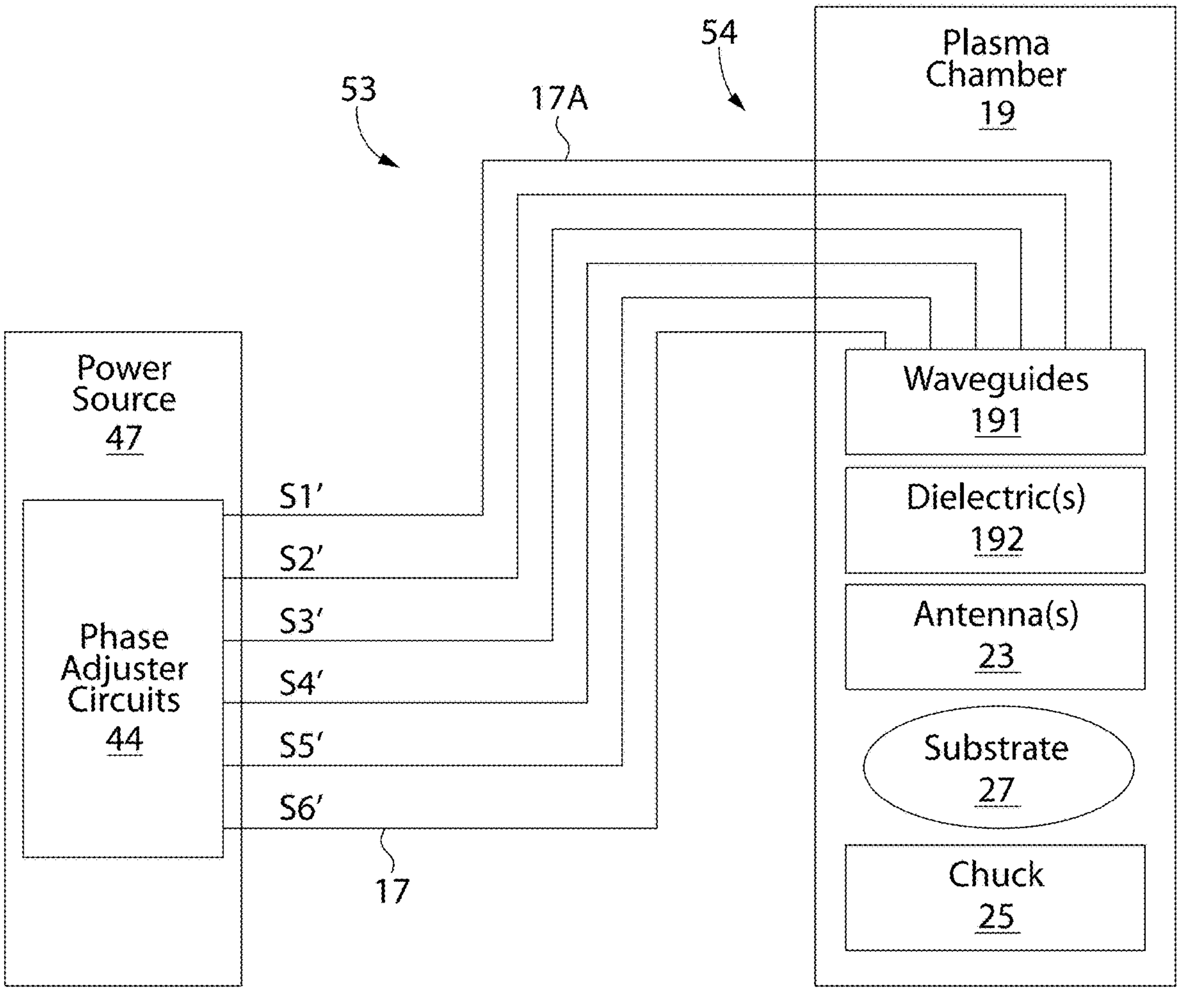
FIG. 1 is a schematic of a system for fabricating a semiconductor according to one embodiment.

The drawings represent one or more embodiments of the present invention(s) and do not limit the scope of invention.

DETAILED DESCRIPTION

The following description of the preferred embodiment(s) is merely exemplary in nature and is in no way intended to limit the invention or inventions. The description of illustrative embodiments is intended to be read in connection with the accompanying drawings, which are to be considered part of the entire written description. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to the interpretation "based entirely on." Furthermore, the term "each," when used in reference to each of a plurality of items, need not refer to each such item in an entire system or apparatus, but may instead simply refer to each of the recited one or more such items in the system.

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

In the following description, where block diagrams or circuits are shown and described, one of skill in the art will recognize that, for the sake of clarity, not all peripheral components or circuits are shown in the figures or described in the description. For example, common components such as memory devices and power sources may not be discussed herein, as their role would be easily understood by those of ordinary skill in the art. Further, the terms "couple" and "operably couple" can refer to a direct or indirect coupling of two components of a circuit.

It is noted that for the sake of clarity and convenience in describing similar components or features, the same or similar reference numbers may be used herein across different embodiments or figures. This is not to imply that the components or features identified by a particular reference number are identical across each embodiment or figure, but only to suggest that the components or features are similar in general function or identity.

Features of the present inventions may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. As used herein, the term "processor" may refer to one or more processors.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present inventions may be embodied in the form of computer-implemented processes and apparatuses such as processor-based data processing and communication systems or computer systems for practicing those processes. The present inventions may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

Semiconductor Processing System

Referring now to the figures, FIG. 1 is a schematic of a system 53 for fabricating a semiconductor according to one embodiment. The system 53 includes a power source 47 and a plasma chamber 19. The power source 47 provides power signals S1'-S6' to waveguides 191 of the plasma chamber 19. The power source 47, which will be discussed in more detail below, includes one or more phase adjuster circuits 44 for providing phase-adjusted signals S1'-S6' at outputs 17 of the power source 47. The adjusted signals S1'-S6' are provided to the plasma chamber by a conductor 17A such as a coaxial cable. In other embodiments, the phase adjuster may be separate from the power source 47, or may be a single circuit.

The exemplified plasma chamber 19 includes one or more antennas 23 and a chuck 25 for holding the substrate. In processes known in the art, the first antenna(s) 23 and the chuck 25, in conjunction with appropriate control systems (not shown) and the plasma in the plasma chamber 19, enable deposition of materials onto a substrate 27 and/or etching of materials from the substrate 27 to fabricate a semiconductor device. The fabricated semiconductor device can be a microprocessor, a memory chip, or other type of integrated circuit or device.

In this embodiment, the antenna(s) 23 receives energy from the power source 47, while chuck 25 is ceramic and holds the substrate 27 and/or provides electrostatic (ESC) functionality. The one ore more antennas 23 may be, for example, one or more slot antennas (see FIG. 6). The antenna may be made of a variety of conductive materials, such as aluminum.

Plasma processing involves energizing a gas mixture by imparting energy to the gas molecules by introducing RF energy into the gas mixture. This gas mixture is contained in a vacuum chamber (the plasma chamber 19), and the RF energy is introduced into the plasma chamber 19 via the antenna(s) 23. Thus, the plasma may be energized by coupling power from the power source 47 into the plasma chamber 19 to perform deposition or etching. In a typical plasma process, the power source 47 generates power at a radio frequency and this power from the power source 47 is transmitted through cables 17A to the plasma chamber 19. In a preferred embodiment, a microwave frequency is used, such as 2.45 GHz, or 2-3 GHz, or at least 300 MHz, or at least 800 MHz, though the invention is not so limited.

As will be discussed in further detail below, the system 53 for fabricating a semiconductor further includes a system 54 for providing multiple signals S1'-S6' to one or more antenna(s) 23 of a plasma chamber 19. In the exemplified system 54, the phase adjuster circuit 44 provides one or more phase-adjusted signals S1'-S6' to waveguides 191. The waveguides 191 (after providing a mode conversion discussed below) provide the signals to one or more dielectrics 192 providing energy to the one or more antennas 23 of the plasma chamber 19.

Circular Polarization and Electric Field Uniformity

The phase adjustment provided by the phase adjuster circuits 44 and the mode conversion provided by the waveguides 191 enable the generation of circular polarization, thereby enabling an improved electric field uniformity for the plasma chamber 19. In coaxial lines, such as lines 17A, the lowest mode of wave propagation is the transverse electromagnetic (TEM) mode, which has orthogonal e-field lines radiating radially out from the center terminal. In a circular waveguide (such as waveguides 191), however, the lowest mode of wave propagation is the TE11, where the e-field lines radiate from one edge of the outer shell to the opposite edge. Since a circular waveguide is symmetrical azimuthally, there are an infinite number of degenerate TE11 modes as the waveguide is rotated. Therefore, when a mode converter is designed to take a wave that is coaxial TEM to circular TE11, the direction of propagation must be exactly defined by the internal geometry to provide the exact direction of the TE11 mode and block the infinite degenerate modes. Each TE11 mode is linearly polarized if propagation is solely along a one of the degenerate modes, so a mode converter that specifies an exact direction of TE11 propagation is said to be linearly polarized. A TE11 circular waveguide becomes circularly polarized when two orthogonal linear modes are propagated where there is a 90 degree phase difference between the orthogonal modes. Circular polarization is desirable for field uniformity in the chamber as it guarantees azimuthal symmetry since any non-uniformity at a given radius is averaged out over a full rotation of the field.

One challenge for circular polarization is that it typically requires stability of the load to which the waveguide is propagating in order to maintain the phase relation between the two orthogonal modes that are being stimulated (plus exciting two orthogonal modes on the input side is difficult itself). This is incompatible with the varying plasma load in a plasma chamber such as plasma chamber 19. To overcome this, the invention described herein may recreate circular polarization in the aggregate of multiple linearly polarized TE11 circular inputs. As will be discussed in more detail below with regard to FIG. 4, to help accomplish this, a phase delay is placed on each linear input feed 17A such that the total delay over all the inputs 17A creates a 360 degree rotation. In other words, if you have N feeds, the phase delay of an adjacent feed is 360/N degrees.

Power Source Providing Phase Delay

Figure 2:
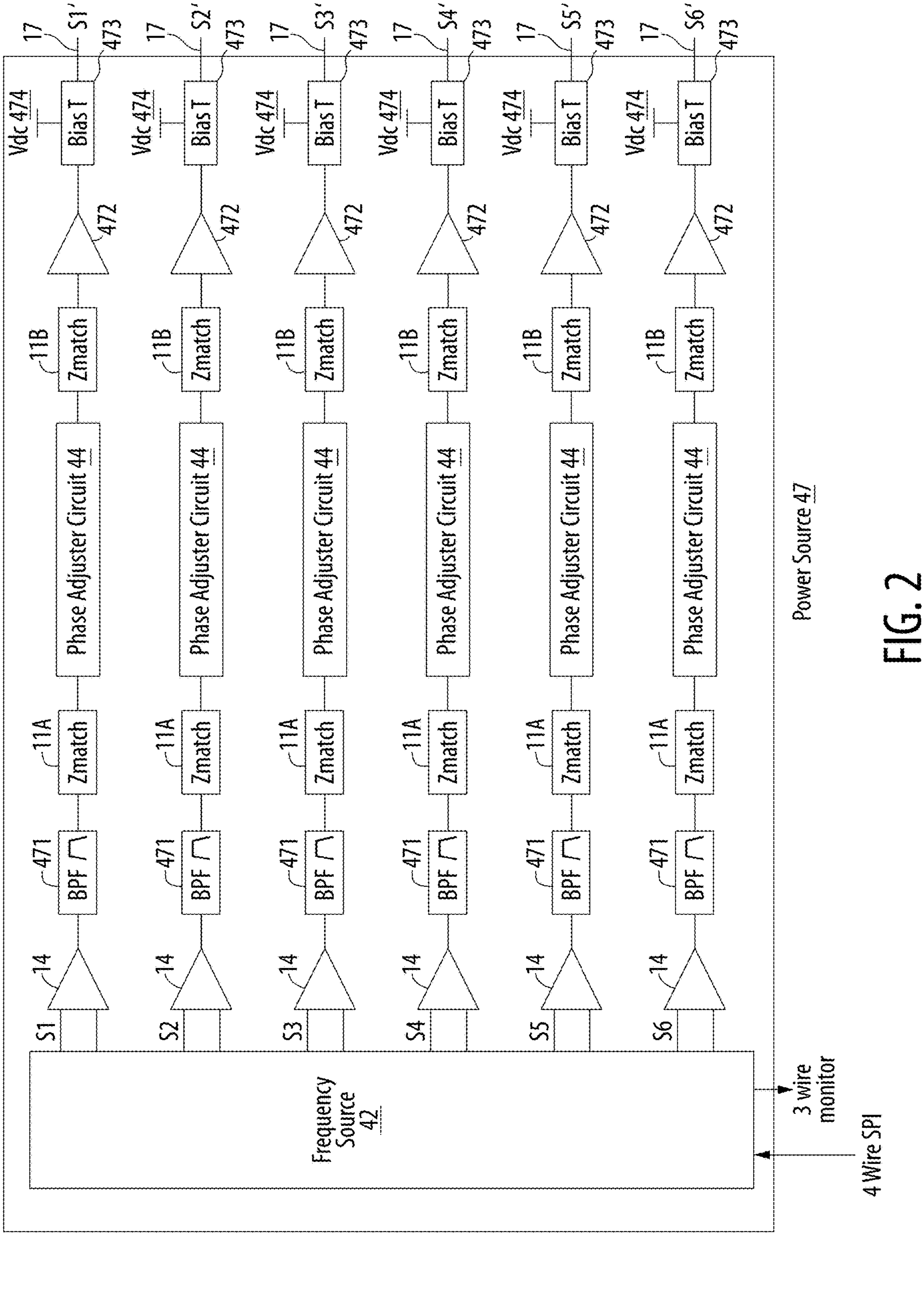
FIG. 2 is a schematic of a power source for providing multiple signals to a plasma chamber according to one embodiment.

FIG. 2 is a schematic of a power source 47 for providing multiple signals having such a phase delay, according to one embodiment. A frequency source 42 provides initial signals S1-S6, which may have differing frequencies. In a preferred embodiment, a microwave frequency is used, such as 2.45 GHz, or 2-3 GHz, or at least 300 MHz, or at least 800 MHz. In the exemplified embodiment, the frequency source is a six-output clock generator AD9518 as provided by Analog Devices, but the invention is not so limited. As shown, the signals S1-S6 from the frequency source may be amplified by amplifier 14 (e.g., a differential RF low noise amplifier), filtered by filter 471 (e.g., a bandpass filter) before being provided to a phase adjuster circuit 44. The power source may also include one or more matching circuits 11A, 11B positioned before or after the phase adjuster circuit 44. The operation and potential configurations for the one or more impedance matching circuits 11A, 11B is described in more detail in commonly-owned U.S. Publication Nos. 2021/0183623 and 2021/0327684, which are incorporated herein by reference in their entireties. It is noted that the components shown in FIG. 2 are only exemplary and not intended to limit the invention.

The phase adjuster circuits 44 may be any circuit or circuits configured to adjust the phase of received signals as discussed herein. In the exemplified embodiment, the phase adjuster circuits are HMC631 vector modulators from Analog Devices that receive an analog 40 dB gain with 0-360 degree phase control (not shown). The power source 47 may also amplify the phase-adjusted signals S1'-S6' via drivers 472 (e.g., a 1 W driver power amplifier). Further, a bias tee 473 may inject a DC voltage from a DC voltage source 474. The one or more phase-adjusted signals S1'-S6' are provided to the outputs 17. Note that it is not necessary that each signal is phase adjusted. For example, signal S1 may receive no phase adjustment ($\theta_1$=0 degrees), while signal S2 has a phase of 60 degrees ($\theta_2$=60 degrees), signal S3 has a phase of 120 degrees ($\theta_3$=120 degrees), signal S4 has a phase of 180 degrees ($\theta_4$=180 degrees), signal S5 has a phase of 240 degrees ($\theta_5$=240 degrees), and signal S6 has a phase of 300 degrees ($\theta_{6=300}$ degrees).

Commonly owned U.S. Pat. No. 9,345,122, the disclosure of which is incorporated herein by reference in its entirety, provide examples of RF generators that may be applied to the power sources discussed herein.

Signal Receiving Portion

Figure 3:
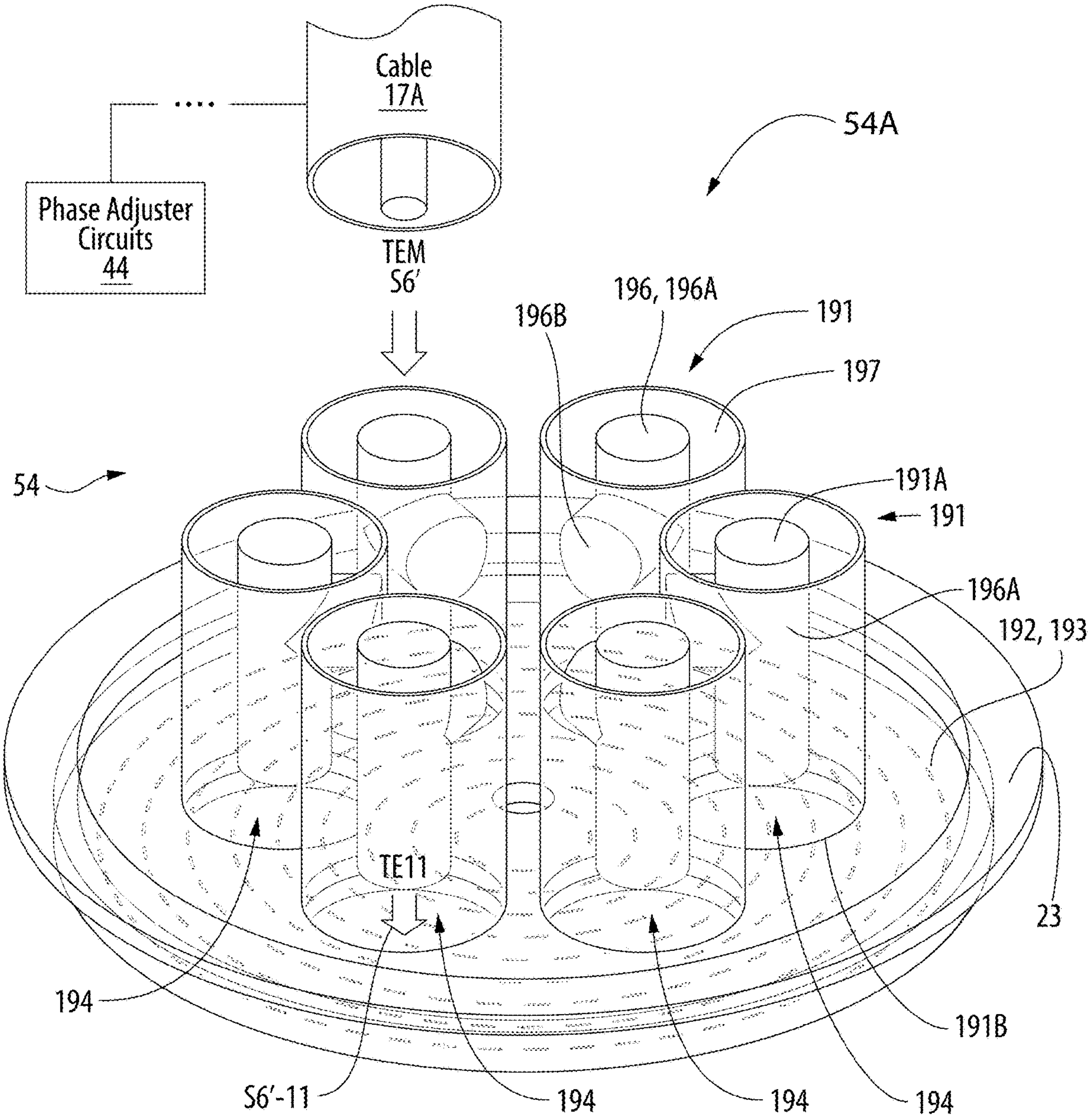
FIG. 3 is an isometric view of a system for providing multiple signals to a plasma chamber according to a first embodiment.
Figure 4:
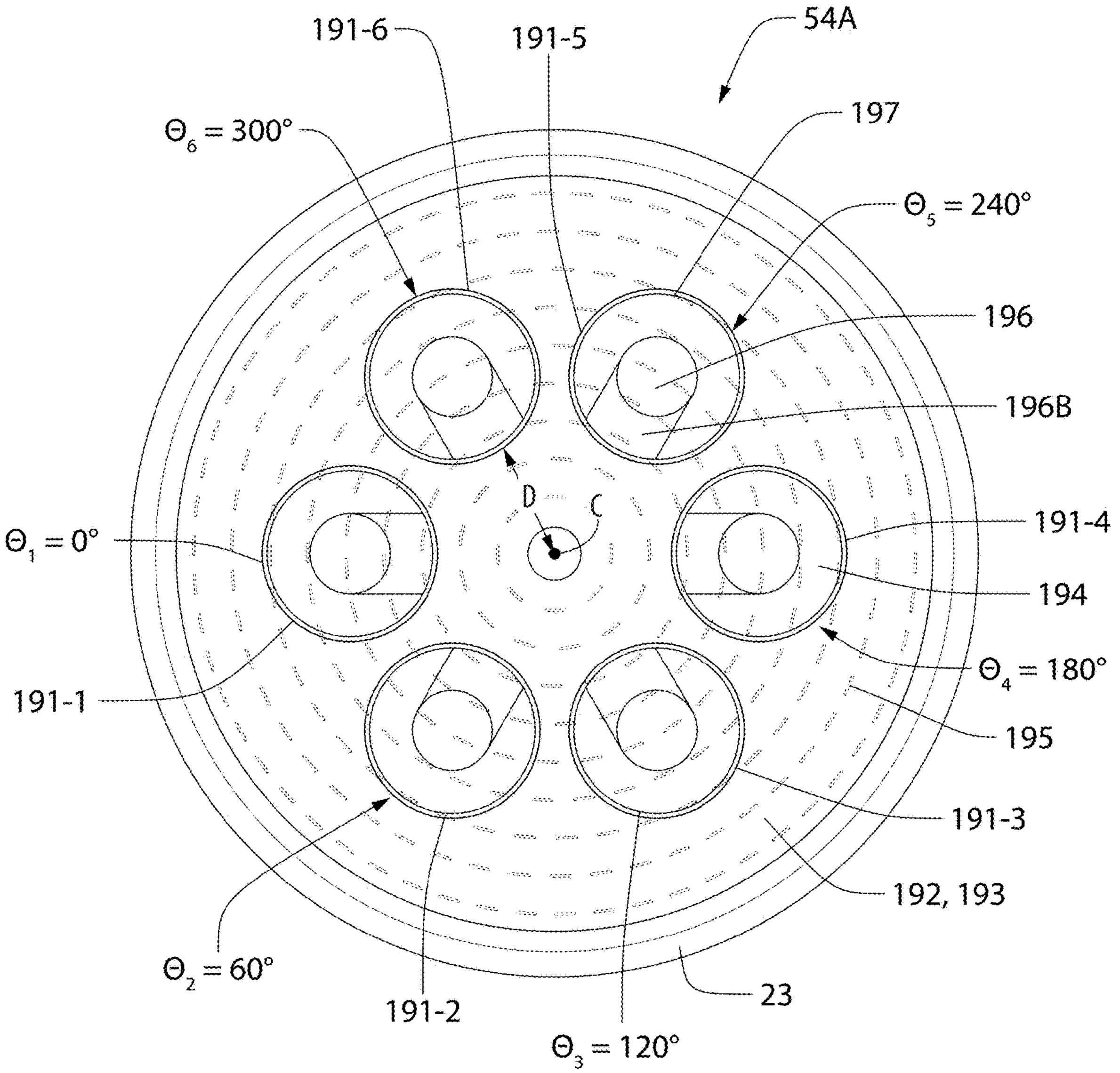
FIG. 4 is a top view of the signal receiving portion of the system according to the first embodiment.

FIG. 3 is an isometric view of the system 54 for providing multiple signals to an antenna 23 of a plasma chamber according to a first embodiment. The system 54 includes a signal receiving portion 54A. FIG. 4 is a top view of the signal receiving portion 54A. FIGS. 3-4 will be described together.

FIG. 3 shows how the system 54 includes both the phase adjuster circuits 44 and the signal receiving portion 54A. Note that while the phase adjuster circuits of FIG. 2 form part of the power source 47, in other embodiments they may be separate. The signal-receiving portion 54A includes a dielectric plate 192 configured to distribute received energy to the antenna 23 of the plasma chamber. In a preferred embodiment, the dielectric plate 192 is made from quartz, which provides a thermal and mechanical advantage. But the invention is not limited to a particular dielectric material. In this embodiment, the dielectric plate 192 has a circular face 193 and six receiving areas 194 positioned at a substantially equal distance from each other and at a substantially equal distance D from a center point, here, a center C the dielectric plate 192. "Substantially equal" is understood to encompass plus or minus 10% of what is equal. Further, the receiving areas are evenly spaced azimuthally around the center of the dielectric plate. The invention, however, is not limited to these characteristics. For example, other dielectric plates may have N number of receiving areas, where N is a natural number greater than one. Further, the antenna 23 upon which the dielectric plate 192 rests may be segmented, comprising a plurality of antennas adjacent to one another and separated by dielectric material, each of the plurality of electrode segments receiving a separate one of the signals S1'-S6'. Such an embodiment will be discussed below with respect to FIGS. 7-10.

The signal-receiving portion 54A of system 54 further includes six circular waveguides 191 positioned over (e.g., on or above) the receiving areas 194 of the dielectric plate 192 such that each receiving area 194 of the six receiving areas 194 has a corresponding circular waveguide 191. Each of the circular waveguides has an input end 191A, an output end 191B, and a mode converter 196. The mode converter 196 is positioned between the input end 191A and the output end 191B and configured to convert a received transverse electromagnetic (TEM) mode signal S6' from a conductor 17A (such as a coaxial cable) to a transverse electric (TE11) mode signal S6'-11 to be output by the circular waveguide 191. It is noted that the invention is not limited to TEM and TE11 modes, as other first and second transverse modes may be used, including other transverse electric modes, transverse magnetic modes, and/or transverse electromagnetic modes. Such other modes may be useful, for example, where the dielectric 192 or antenna 23 is not of a circular shape.

The mode converter may be any type of mode converter for converting the received signal from TEM mode to TE11 mode. The exemplified mode converter 196 includes a center feed 196A and a side portion 196B to help cause the mode conversion. Further, the side portion 196B is connected to a cylindrical outer wall 197 (made from, e.g., aluminum) that surrounds the mode converter 196 and rests on the dielectric plate 192. The invention, however, is not limited to any particular structure for carrying out the mode conversion.

The system 54 further includes the phase adjuster circuits 44, which are discussed above with respect to FIG. 2. The adjustment of the phase, along with the mode conversion, enables the generation of circular polarization. The phase adjuster circuits are configured to delay the phase of one or more of the linearly polarized signals TEM mode signals S1'-S6' being provided the cables 17A to the circular waveguides 191 such that, of the N circular waveguides 191, those adjacent have their received TEM mode signals S1'-S6' differ in phase by approximately 360/N, where "approximately 360/N" is understood to encompass plus or minus 10% of 360/N. In other embodiments, approximately could mean, for example, plus or minus 2%. In this example, N equals 6. Thus, each of the received TEM mode signals S1'-S6' differ in phase by 60 degrees. Thus, as shown in FIG. 4, the phases for the respective six TEM mode signals are as follows: S1' at a first waveguide 191-1 has a phase $\theta_1$ of 0 degrees, S2' at a second waveguide 191-2 has a phase $\theta_2$ of 60 degrees, S3' at a third waveguide 191-3 has a phase $\theta_3$ of 120 degrees, S4' at a fourth waveguide 191-4 has a phase $\theta_4$ of 180 degrees, S5' at a fifth waveguide 191-5 has a phase $\theta_5$ of 240 degrees, and S6' at a sixth waveguide 191-6 has a phase $\theta_6$ of 300 degrees. Thus, the adjustment of the phase of the TEM mode signals S1'-S6' causes a full 360 degree phase rotation for the TEM mode signals received by the circular waveguides 191. With this phase relation, the direction of each linear polarization is set by the TEM to TE11 mode converter 196 to be pointing towards the center C of the dielectric plate 192, and thus the center of the plasma chamber 19. With this structure, the desired circularly polarized field is reconstructed.

In another embodiment, if there were four waveguides and four receiving areas, the phases would differ by 90 degrees, and thus the respective signals could have phases, for example of 0 degrees, 90 degrees, 180 degrees, and 240 degrees. These are only examples and are not intended to limit the invention. Further, the phase (θ) of the TEM mode signal for each one of the N circular waveguides may alternatively be expressed as follows:

$$\theta_{N+1} = \theta_N + \frac{360}{N}.$$

It is noted that the system 54 may further include a control circuit, which may include a processor such as those discussed herein. The control circuit may control the phase adjuster circuits 44 and/or other portions of the system 54.

Figure 5:
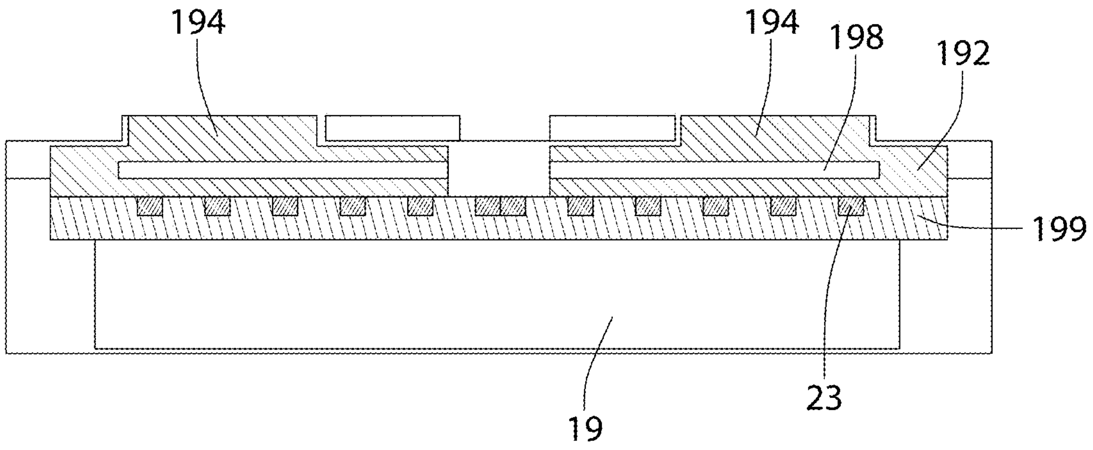
FIG. 5 is a cross-sectional view of the dielectric and antenna arrangement according to the first embodiment.

FIG. 5 is a cross-sectional view of the dielectric 192, antenna 23, and plasma chamber 19. The exemplified receiving areas 194 of an upper dielectric 192 are configured to receive TE11 signals from the waveguides (see waveguides 191 of FIG. 4). The upper dielectric 192 distributes energy received from the waveguides to the antenna 23. As shown, a conductive center blocker 198 may be positioned between the dielectric 192 and the antenna 23. This center blocker may prevent the energy from the waveguides 191 from being directly through the dielectric plate 192 to the antenna 23, instead causing energy to wrap around the dielectric 192. Thus, the center blocker 198 may limit the center field. The center blocker 198 may be made of aluminum or another conductive materials. As shown, a lower dielectric 199 may also be included below the antenna 23 and between the antenna 23 and the plasma chamber 19.

Figure 6:
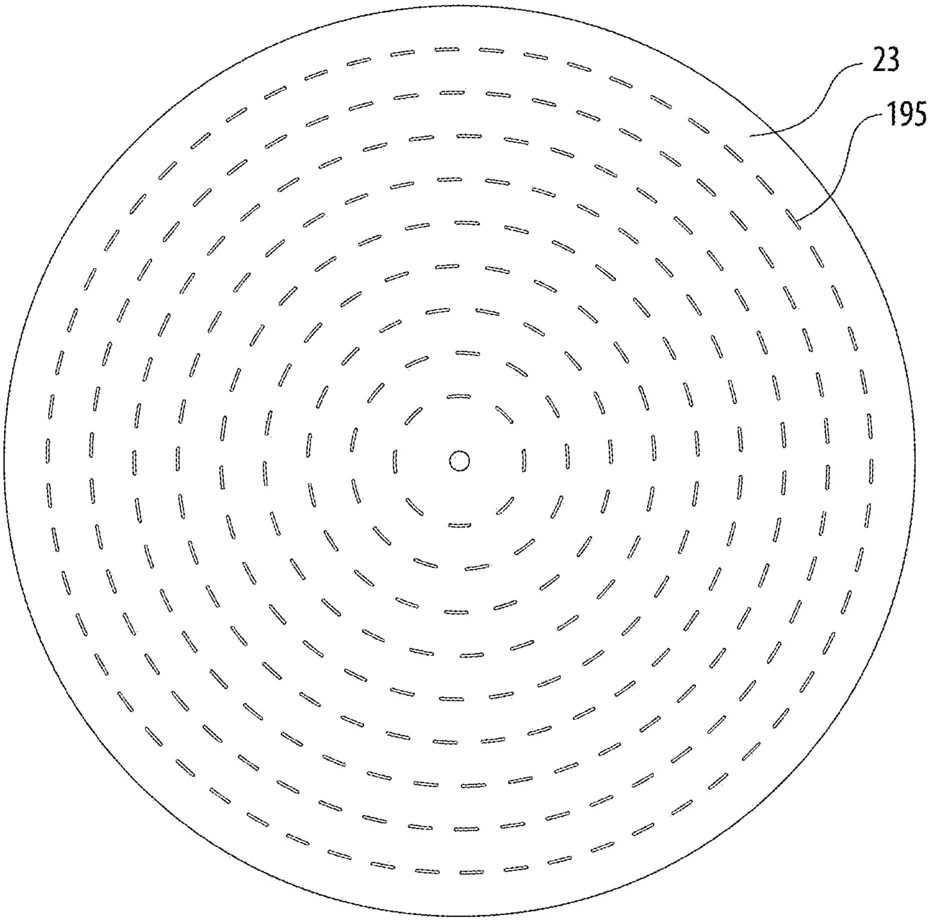
FIG. 6 is a top view of the antenna according to the first embodiment.

FIG. 6 is a top view of the antenna 23 according to the first embodiment. As shown, the antenna 23 may be a radial slot antenna having multiple slots 195 positioned around a circular face of the antenna. In other embodiments, the antenna 23 may have different shapes, and/or differently sized or shaped slots. The antenna may be made of a variety of conductive materials, such as aluminum.

Second Embodiment of Signal Receiving Portion

FIGS. 7-10 collectively illustrate a signal receiving portion 254 according to a second embodiment. While the signal receiving portion 54 of FIGS. 3-6 utilize a single antenna 23 and a single top dielectric plate 192 over the antenna 23 acting as a shared waveguide for all the waveguides 191 to create a distributed system across a single antenna 23, the second embodiment of FIGS. 7-10 splits the antenna into separate antennas 223. Similarly, the top dielectric is comprised of separate top dielectrics 292A. In the exemplified embodiment, each antenna 223 is positioned between a top dielectric 292A and a bottom dielectric 292B, and this unit is positioned on a lower dielectric plate 299, though the invention is not so limited. This embodiment will be discussed in more detail below.

Figure 7:
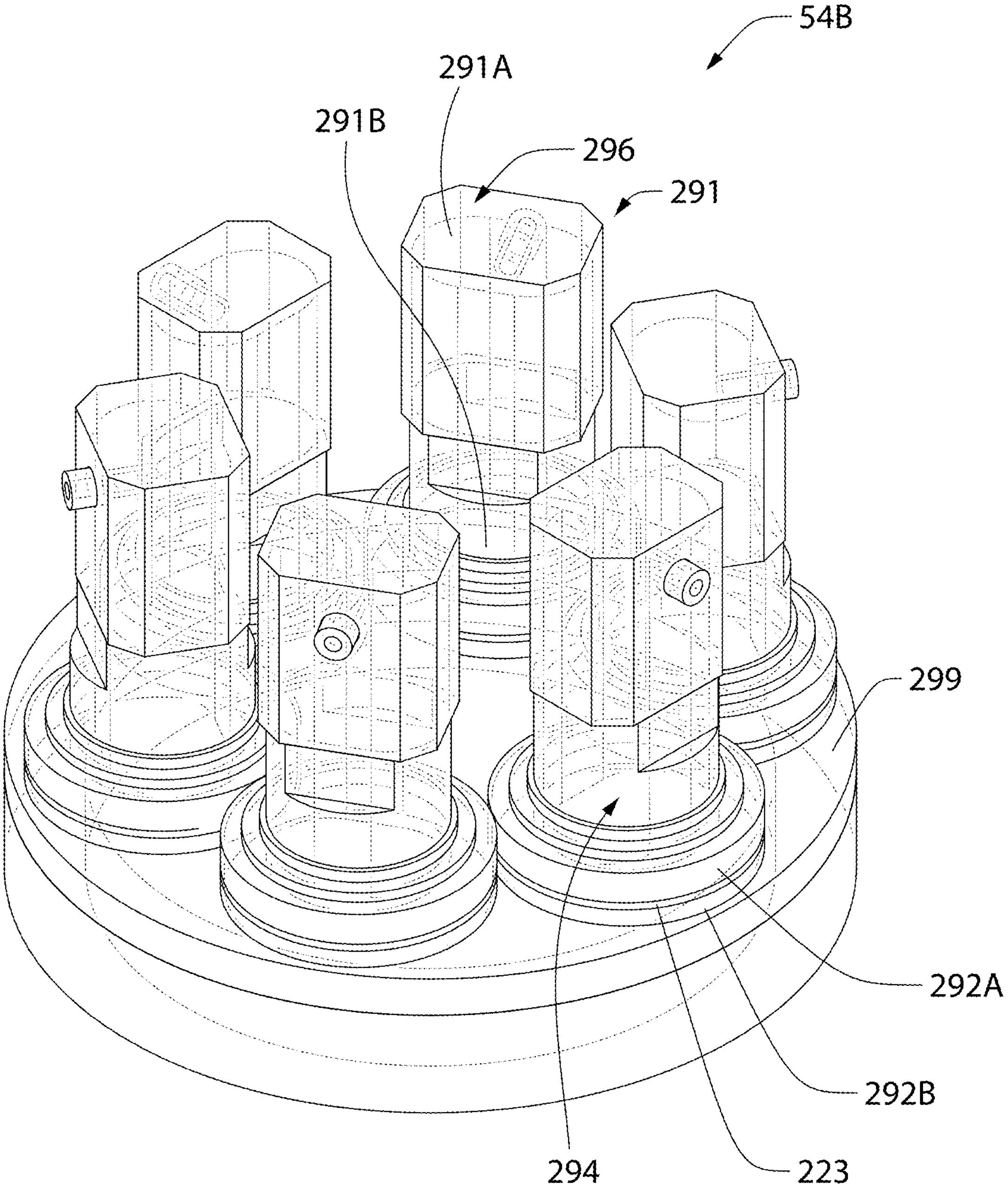
FIG. 7 is an isometric view of a signal receiving portion according to a second embodiment.
Figure 8:
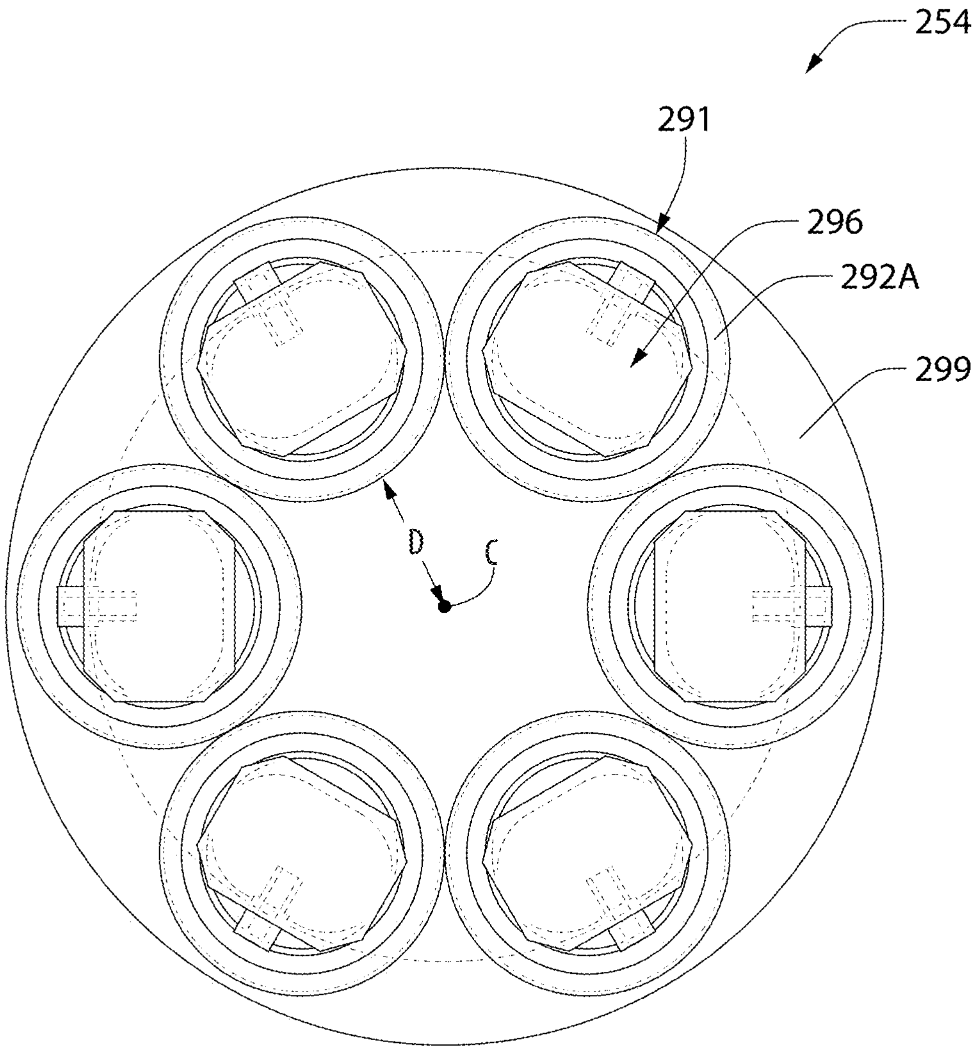
FIG. 8 is a top view of the signal receiving portion of the system according to the second embodiment.
Figure 9:
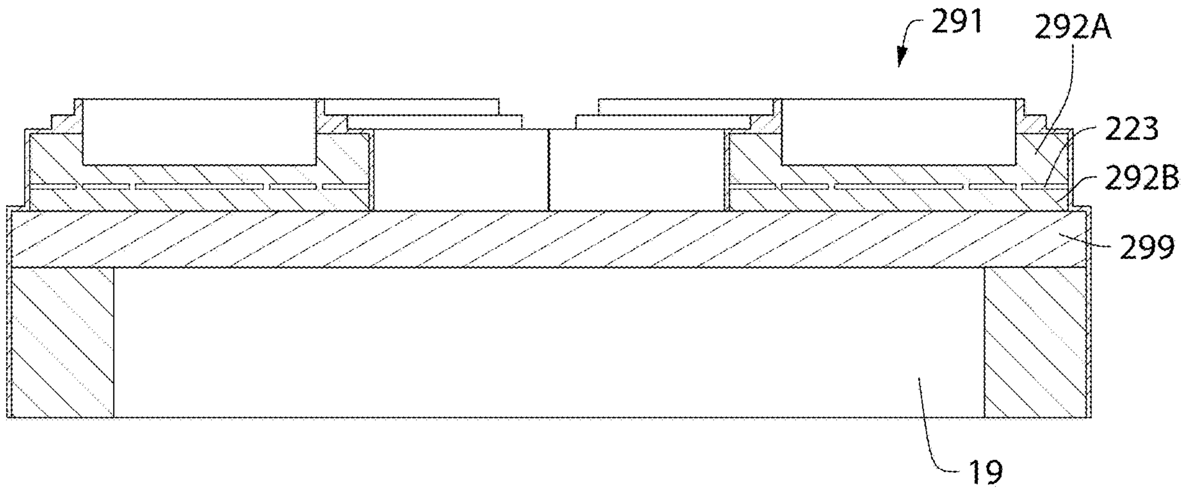
FIG. 9 is a cross-sectional view of the dielectric and antenna arrangement according to the second embodiment.
Figure 10:
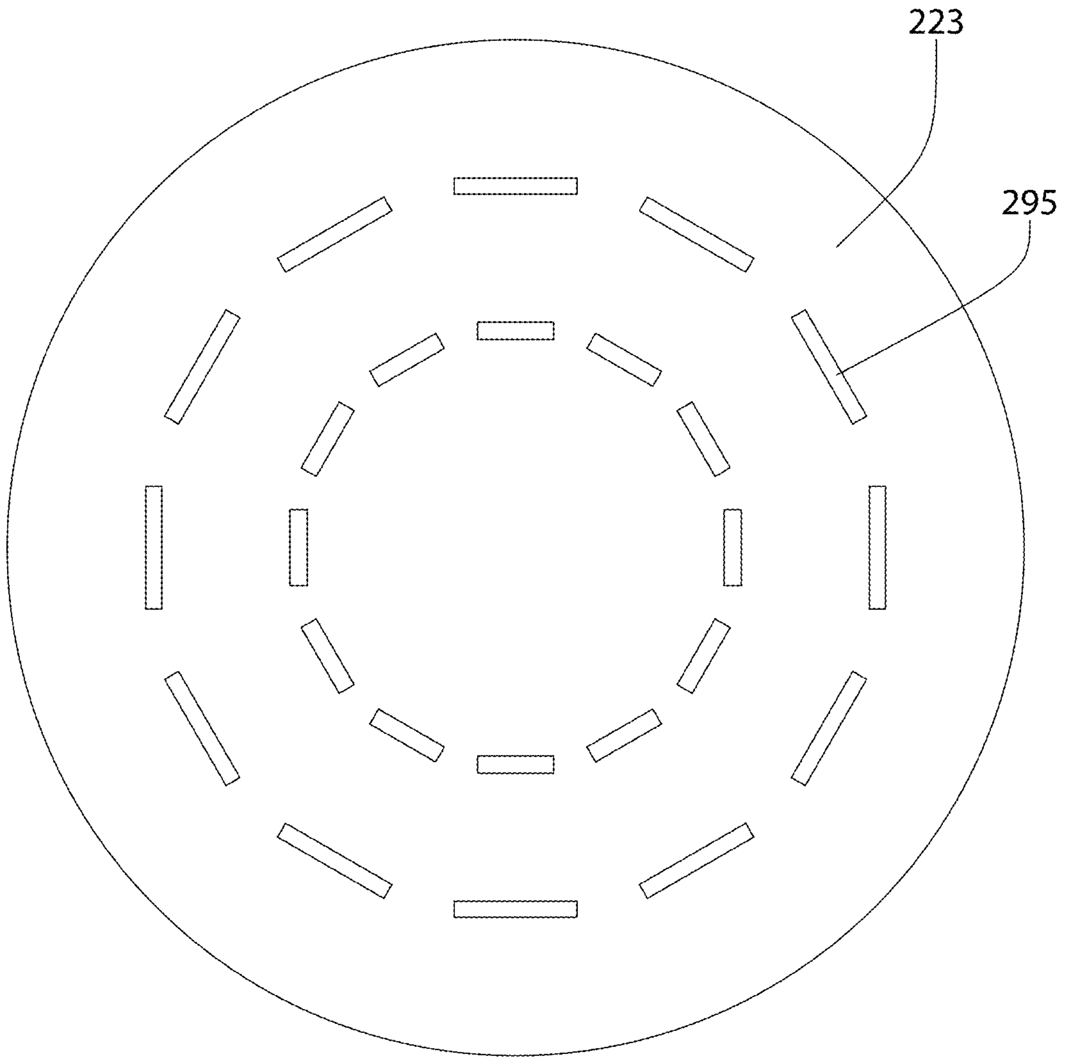
FIG. 10 is a top view of the antenna according to the second embodiment.

FIG. 7 is an isometric view of the signal receiving portion 254 according to the second embodiment. It is similar to FIG. 3 in that it includes waveguides 291 that are spaced azimuthally and comprise mode converters 296. But by contrast, each waveguide 291 has a corresponding antenna 223 positioned between a top dielectric 292A and a bottom dielectric 292B. FIG. 8 is a top view of the signal receiving portion 254. It shows the waveguides 291 positioned at a substantially equal distance from each other and at a substantially equal distance D from a center point C. Further, the waveguides 291 are spaced azimuthally around center point C, and over a lower dielectric plate 299. FIG. 9 is a cross-sectional view of the dielectric 292A, 292B, 299 and antenna 223 arrangement according to the second embodiment. It shows the antennas 223 positioned between the top dielectric 292A and the bottom dielectric 292B, and over the lower dielectric plate 299 that is positioned above the plasma chamber 19. FIG. 10 is a top view of one of the slot antennas 223 comprising slots 295.

According to this second embodiment, the invention may be understood as a system 53 for providing energy to a plasma chamber having multiple power signal inputs such as that shown in FIG. 1, but the system 53 including N top dielectrics 292A evenly positioned at a substantially equal distance D from a center point C, wherein N is a natural number greater than one. In this embodiment (as with the prior), N is equal to 6, but the invention is not so limited. The system 53 further includes N antennas 223, wherein each top dielectric 292A of the N top dielectrics 292A is positioned over a corresponding antenna 223 of the N antennas, and each top dielectric 292A of the N dielectrics 292A is configured to provide received energy to its corresponding antenna 223 of the N antennas 223. The system 53 further includes N circular waveguides 291, wherein each of the N circular waveguides 291 is positioned over a corresponding one of the N top dielectrics 292A. Each of the N circular waveguides 291 comprises an input end 291A, an output end 291B, and a mode converter 296 positioned between the input end 291A and the output end 291B and configured to convert a received first transverse mode signal to a second transverse mode signal to be output by the circular waveguide 291 to the corresponding top dielectric 292A of the one or more dielectrics 292A. The system 53 further includes phase adjuster circuit 44 configured to adjust the phase of at least one of the transverse mode signals received by the N circular waveguides 291 such that the received transverse mode signals differ in phase by approximately 360/N for adjacent ones of the N circular waveguides 291. In other words, each adjacent pair of waveguides differs in phase by 360/N. Thus, in the exemplified embodiment having 6 waveguides, the each pair would differ in phase by 60 degrees (e.g., 0 degrees, 60 degrees, 120 degrees, 180 degrees, 240 degrees, and 300 degrees).

Thus, according to this embodiment, the above-reference one or more dielectrics comprise N top dielectrics 292A, the one or more antennas comprise N antennas 223, and each top dielectric 292A of the N top dielectrics has a corresponding antenna 223 of the N antennas. Further, each of the top dielectrics 292A comprises a corresponding one of the N receiving areas 294. Thus, in this embodiment, each top dielectric 292A may be considered a receiving area. Further, each of the N antennas 223 is positioned over a corresponding bottom dielectric 292 B.

Method of Improving Electric Field Uniformity

Finally, in another aspect, the invention may be understood as a method to control microwave power delivered to plasma chamber receiving multiple inputs to improve the uniformity of an electric field on the antenna of the plasma chamber. The method includes transmitting, via N outputs of a power source, N first transverse mode signals (e.g., TEM mode signals), wherein N is a natural number greater than 1. In another operation, N circular waveguides receive the N first transverse mode signals, wherein each of the N circular waveguides comprises an input end, an output end, and a mode converter positioned between the input end and the output end. In another operation, for each of the circular waveguides, the mode converter converts the received first transverse mode signal to a second transverse mode signal (e.g., TE11 mode signal) to be output by the circular waveguide. In another operation, the circular waveguide transmits the second transverse mode signal to one or more dielectrics positioned over an electrode of a plasma chamber, the one or more dielectrics comprising N receiving areas positioned at a substantially equal distance from each other and at a substantially equal distance from a center point. In another operation, the phase of at least one of the first transverse mode signals received by the N circular waveguides is adjusted such that, of the N circular waveguides, those adjacent have their received first transverse mode signals differ in phase by approximately 360/N.

While the inventions have been described with respect to specific examples including presently preferred modes of carrying out the inventions, those skilled in the art will appreciate that there are numerous variations and permutations of the above described systems and techniques. It is to be understood that other embodiments may be utilized and structural and functional modifications may be made without departing from the scope of the present inventions. Thus, the spirit and scope of the inventions should be construed broadly as set forth in the appended claims.

What is claimed is:

1. A system for providing energy to a plasma chamber having multiple power signal inputs, the system comprising:

one or more dielectrics configured to distribute received energy to one or more antennas of a plasma chamber, the one or more dielectrics comprising N receiving areas positioned at a substantially equal distance from each other and at a substantially equal distance from a center point, wherein N is a natural number greater than one;

N circular waveguides positioned over the N receiving areas of the one or more dielectrics such that each receiving area of the N receiving areas has a corresponding circular waveguide of the N circular waveguides, wherein each of the N circular waveguides comprises:

an input end;

an output end; and a mode converter positioned between the input end and the output end and configured to convert a received first transverse mode signal to a second transverse mode signal to be output by the circular waveguide to the corresponding receiving area of the one or more dielectrics; and at least one phase adjuster circuit configured to adjust the phase of at least one of the first transverse mode signals received by the N circular waveguides such that, of the N circular waveguides, those adjacent have their received first transverse mode signals differ in phase by approximately 360/N.

2. The system of claim 1 wherein the first transverse mode signal is a transverse electromagnetic (TEM) mode signal and the second transverse mode signal is a transverse electric (TE11) mode signal.

3. The system of claim 1 wherein the adjustment of the phase of the at least one first transverse mode signals enables the generation of circular polarization.

4. The system of claim 1 further comprising a lower dielectric positioned below the one or more antennas.

5. The system of claim 1 wherein the N receiving areas are evenly spaced azimuthally around the center point.

6. The system of claim 1:

wherein the one or more dielectrics comprise a single dielectric plate, and the one or more antennas comprises a single antenna;

wherein the single dielectric plate comprises the N receiving areas; and wherein the center point is at the center of the single dielectric plate.

7. The system of claim 6 wherein the single dielectric plate comprises a circular face, and the center point is the center of the single dielectric plate.

8. The system of claim 1:

wherein the one or more dielectrics comprise N top dielectrics, and the one or more antennas comprise N antennas, wherein each top dielectric of the N top dielectrics has a corresponding antenna of the N antennas; and wherein each of the top dielectrics comprises a corresponding one of the N receiving areas.

9. The system of claim 8 wherein each of the N antennas is positioned over a corresponding bottom dielectric.

10. The system of claim 1 wherein the phase (θ) of the first transverse mode signal for each one of the N circular waveguides is $$\theta_{N+1} = \theta_N + \frac{360}{N}.$$

11. The system of claim 1 wherein the at least one phase adjuster circuit comprises N phase adjuster circuits such that each of the N circular waveguides has a corresponding phase adjuster circuit.

12. The system of claim 1 wherein the adjustment of the phase of the at least one of the first transverse mode signals causes a full 360 degree phase rotation for the first transverse mode signals received by the N circular waveguides.

13. The system of claim 1 wherein each of the N circular waveguides further comprises a cylindrical wall that surrounds the mode converter.

14. The system of claim 13 wherein each cylindrical wall rests on the one or more dielectrics.

15. The system of claim 1 wherein each of the second transverse mode signals output by the N circular waveguides is linearly polarized.

16. The system of claim 1 wherein the input end each of the N circular waveguides is configured to couple to a coaxial cable providing the first transverse mode signal.

17. A semiconductor processing system comprising:

a power source transmitting, via N outputs, N first transverse mode signals, wherein N is a natural number greater than 1;

at least one phase adjuster circuit; and a plasma chamber comprising:

N circular waveguides configured to receive the N first transverse mode signals, wherein each of the N circular waveguides comprises:

an input end;

an output end; and a mode converter positioned between the input end and the output end and configured to convert the received first transverse mode signal to a second transverse mode signal to be output by the circular waveguide; and one or more dielectrics configured to receive the second transverse mode signals from the N circular waveguides and to distribute energy from the second transverse mode signals to one or more antennas of the plasma chamber, the one or more dielectrics comprising N receiving areas positioned at a substantially equal distance from each other and at a substantially equal distance from a center point;

wherein the N circular waveguides are positioned adjacent to the N receiving areas of the one or more dielectrics such that each receiving area of the N receiving areas has a corresponding circular waveguide of the N circular waveguides; and wherein the at least one phase adjuster circuit is configured to adjust the phase of at least one of the first transverse mode signals received by the N circular waveguides such that the received first transverse mode signals differ in phase by approximately 360/N for adjacent ones of the N circular waveguides.

18. The system of claim 17 wherein the first transverse mode signal is a transverse electromagnetic (TEM) mode signal and the second transverse mode signal is a transverse electric (TE11) mode signal.

19. The system of claim 17:

wherein the one or more dielectrics comprise N top dielectrics, and the one or more antennas comprise N antennas, wherein each top dielectric of the N top dielectrics has a corresponding antenna of the N antennas; and wherein each of the top dielectrics comprises a corresponding one of the N receiving areas.

20. A system for providing energy to a plasma chamber having multiple power signal inputs, the system comprising:

N dielectrics evenly positioned at a substantially equal distance from a center point, wherein N is a natural number greater than one;

N antennas, wherein each dielectric of the N dielectrics is positioned over a corresponding antenna of the N antennas, and each dielectric of the N dielectrics is configured to provide received energy to its corresponding antenna of the N antennas;

N circular waveguides, wherein each of the N circular waveguides is positioned over a corresponding one of the N dielectrics, wherein each of the N circular waveguides comprises:

an input end;

an output end; and a mode converter positioned between the input end and the output end and configured to convert a received first transverse mode signal to a second transverse mode signal to be output by the circular waveguide to the corresponding dielectric of the one or more dielectrics; and at least one phase adjuster circuit configured to adjust the phase of at least one of the transverse mode signals received by the N circular waveguides such that the received transverse mode signals differ in phase by approximately 360/N for adjacent ones of the N circular waveguides.

* * * * *